United States Patent

Hirase

(10) Patent No.: US 9,443,896 B2
(45) Date of Patent: Sep. 13, 2016

(54) IMAGING DEVICE

(71) Applicant: Panasonic Intellectual Property Management Co., Ltd., Osaka (JP)

(72) Inventor: Junji Hirase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/715,593

(22) Filed: May 19, 2015

(65) Prior Publication Data

US 2015/0340394 A1    Nov. 26, 2015

(30) Foreign Application Priority Data

May 23, 2014  (JP) ................................. 2014-107473
Dec. 15, 2014  (JP) ................................. 2014-253297

(51) Int. Cl.
   *H01L 27/146*    (2006.01)

(52) U.S. Cl.
   CPC ... *H01L 27/14636* (2013.01); *H01L 27/14609* (2013.01); *H01L 27/14623* (2013.01); *H01L 27/14632* (2013.01); *H01L 27/14643* (2013.01)

(58) Field of Classification Search
   CPC ... H01L 31/113; H01L 31/18; H01L 27/148; H01L 27/146
   USPC .................................... 257/291, 215; 438/59
   See application file for complete search history.

(56) References Cited

U.S. PATENT DOCUMENTS

| | | | | |
|---|---|---|---|---|
| 2005/0224841 | A1* | 10/2005 | Nakamura et al. | 257/215 |
| 2011/0108836 | A1* | 5/2011 | Koyama et al. | 257/43 |
| 2011/0115003 | A1* | 5/2011 | Okita et al. | 257/291 |
| 2011/0215323 | A1 | 9/2011 | Kurokawa et al. | |
| 2011/0216566 | A1* | 9/2011 | Kamata | 363/127 |
| 2013/0313410 | A1 | 11/2013 | Goto | |

FOREIGN PATENT DOCUMENTS

| | | |
|---|---|---|
| JP | 6-244397 | 9/1994 |
| JP | 2006-094263 | 4/2006 |
| JP | 2011-119950 | 6/2011 |
| JP | 2011-129873 | 6/2011 |
| JP | 2011-211699 | 10/2011 |
| JP | 2012-151771 | 8/2012 |
| WO | 2011/067878 | 6/2011 |

* cited by examiner

*Primary Examiner* — Sheng Zhu
(74) *Attorney, Agent, or Firm* — McDermott Will & Emery LLP

(57) ABSTRACT

An imaging device includes a semiconductor substrate; and a unit pixel cell provided to a surface of the semiconductor substrate. The unit pixel cell includes: a photoelectric converter that includes a pixel electrode and a photoelectric conversion layer located on the pixel electrode, the photoelectric converter converting incident light into electric charges; a charge detection transistor that includes a part of the semiconductor substrate and detects the electric charges; and a reset transistor that includes a first gate electrode and initializes a voltage of the photoelectric converter. The pixel electrode is located above the charge detection transistor. The reset transistor is located between the charge detection transistor and the pixel electrode. When viewed from a direction normal to the surface of the semiconductor substrate, the pixel electrode covers an entire portion of the first gate electrode.

15 Claims, 18 Drawing Sheets

IMAGING DEVICE

BACKGROUND

1. Technical Field

The present disclosure relates to an imaging device.

2. Description of the Related Art

A solid-state imaging device (image sensor) includes a plurality of light receiving units (pixels) arranged in two dimensions. Light incident on the light receiving units is converted into charges as a result of photoelectric conversion. The charges are accumulated in a charge storage capacitance, and signals corresponding to the accumulated charges are read.

With respect to such a solid-state imaging device, a technique is known in which transistors composed of an oxide semiconductor are used for reducing leakage current (for example, refer to Japanese Unexamined Patent Application Publication No. 2011-119950 and Japanese Unexamined Patent Application Publication No. 2011-211699).

In addition, a technique is known in which an organic photoelectric conversion layer is used as a photoelectric conversion device (for example, refer to Japanese Unexamined Patent Application Publication No. 2012-151771).

SUMMARY

It is desired that the reliability of such an imaging device be improved.

One non-limiting and exemplary embodiment provides an imaging device whose reliability can be improved.

In one general aspect, the techniques disclosed here feature an imaging device that includes a semiconductor substrate; and a unit pixel cell provided to a surface of the semiconductor substrate, the unit pixel cell including: a photoelectric converter that includes a pixel electrode and a photoelectric conversion layer located on the pixel electrode, the photoelectric converter converting incident light into electric charges; a charge detection transistor that includes a part of the semiconductor substrate and detects the electric charges; and a reset transistor that includes a first gate electrode and initializes a voltage of the photoelectric converter, wherein the pixel electrode is located above the charge detection transistor, the reset transistor is located between the charge detection transistor and the pixel electrode, and when viewed from a direction normal to the surface of the semiconductor substrate, the pixel electrode covers an entire portion of the first gate electrode.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
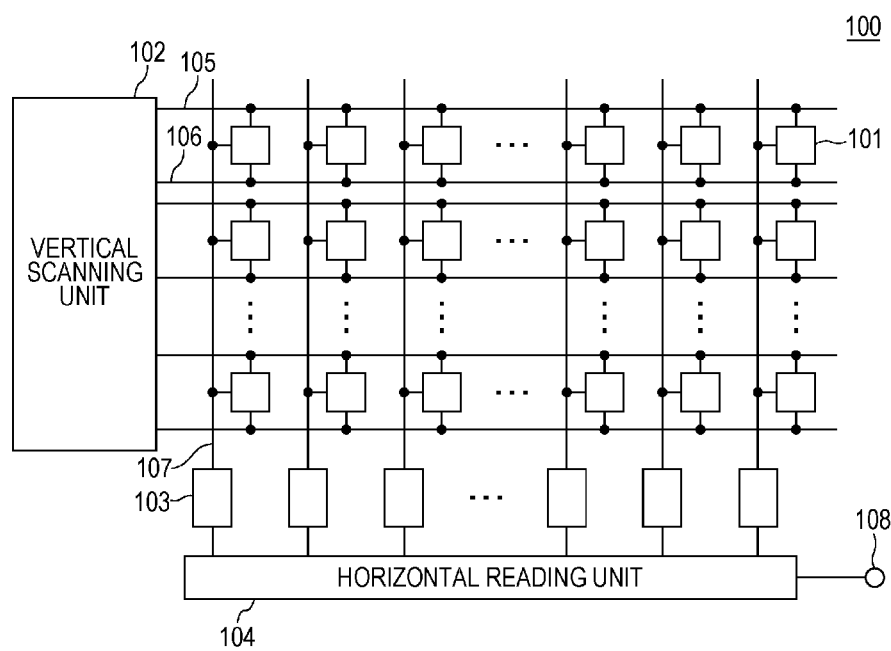
FIG. 1 is a block diagram illustrating a solid-state imaging device according to a first embodiment.

An imaging device according to an aspect of the present disclosure includes a semiconductor substrate; and a unit pixel cell provided to a surface of the semiconductor substrate, the unit pixel cell including: a photoelectric converter that includes a pixel electrode and a photoelectric conversion layer located on the pixel electrode, the photoelectric converter converting incident light into electric charges; a charge detection transistor that includes a part of the semiconductor substrate and detects the electric charges; and a reset transistor that includes a first gate electrode and initializes a voltage of the photoelectric converter, wherein the pixel electrode is located above the charge detection transistor, the reset transistor is located between the charge detection transistor and the pixel electrode, and when viewed from a direction normal to the surface of the semiconductor substrate, the pixel electrode covers an entire portion of the first gate electrode.

According to this configuration, since the pixel electrode blocks incident light, it is possible to suppress entry of incident light into a channel region of the reset transistor. Therefore, it is possible to suppress variation in threshold voltage of the reset transistor due to an effect of incident light. As a result, variation in the operating characteristic and temporal changes of the pixels can be suppressed, thereby improving reliability.

For example, the part of the semiconductor substrate may comprise a first semiconductor. The reset transistor may include at least a part of a first semiconductor layer, the at least a part of the first semiconductor layer comprising a second semiconductor. A band gap of the second semiconductor may be larger than a band gap of the first semiconductor.

According to this configuration, since the reset transistor includes the semiconductor whose band gap is larger than that of the semiconductor of which the semiconductor substrate is composed, leakage current in the charge storage capacitance caused by minor carriers can be suppressed. Strictly, the term "band gap" is used for crystals, but an energy gap optically observed in an amorphous semiconductor as an effective band gap will also be referred to as a "band gap" herein.

For example, the reset transistor may include a first source electrode and a first drain electrode. The charge detection transistor may be connected to the pixel electrode and one of the first source electrode and the first drain electrode.

For example, the reset transistor may include a first source electrode, a first drain electrode, and at least a part of a first semiconductor layer, and when viewed from the direction normal to the surface of the semiconductor substrate, the pixel electrode covers an entire portion of a first charge transport region that is a region of the first semiconductor layer located between the first source electrode and the first drain electrode.

According to this configuration, it is possible to further suppress the entry of light into the reset transistor.

For example, when viewed from the direction normal to the surface of the semiconductor substrate, the pixel electrode may cover the first source electrode and the first drain electrode.

According to this configuration, it is possible to further suppress the entry of light into the reset transistor.

For example, the part of the semiconductor substrate may comprise a first semiconductor. The unit pixel cell may further include: a charge storage capacitance that accumulates at least a part of the electric charges; and a clamp transistor that is located between the charge detection transistor and the pixel electrode, the clamp transistor including a second source electrode, a second drain electrode, a second gate electrode, and at least a part of a second semiconductor layer, the at least a part of the second semiconductor layer comprising a third semiconductor, the second gate electrode and one of the second source electrode and the second drain electrode being connected to the charge storage capacitance. A band gap of the third semiconductor may be larger than a band gap of the first semiconductor.

According to this configuration, an excessive increase in the voltage of the charge storage capacitance can be prevented while reducing the leakage current in the charge storage capacitance. As a result, it is possible to suppress damage to the transistor connected to the charge storage capacitance.

For example, the reset transistor may include at least a part of a first semiconductor layer, the at least a part of the first semiconductor layer comprising a second semiconductor, a band gap of the second semiconductor being larger than the band gap of the first semiconductor. The first semiconductor layer and the second semiconductor layer may be a single continuous semiconductor layer.

For example, when viewed from the direction normal to the surface of the semiconductor substrate, the pixel electrode may cover an entire portion of the second gate electrode.

According to this configuration, it is possible to suppress entry of incident light into a channel region of the clamp transistor. Therefore, it is possible to suppress variation in threshold voltage of the clamp transistor due to an effect of incident light. As a result, variation in the operating characteristic and temporal changes of the pixels can be suppressed, thereby improving reliability.

For example, when viewed from the direction normal to the surface of the semiconductor substrate, the pixel electrode may cover an entire portion of a second charge transport region that is a region of the second semiconductor layer located between the second source electrode and the second drain electrode.

According to this configuration, it is possible to further suppress the entry of light into the clamp transistor.

For example, when viewed from the direction normal to the surface of the semiconductor substrate, the pixel electrode may cover an entire portion of both the second source electrode and the second drain electrode.

According to this configuration, it is possible to further suppress the entry of light into the clamp transistor.

For example, the photoelectric converter may be located above the surface of the semiconductor substrate through a multilayer interconnection structure, the multilayer interconnection structure including a lower interconnection layer and an upper interconnection layer, the lower interconnection layer being closer to the semiconductor substrate than the upper interconnection layer is. The reset transistor includes at least a part of a first semiconductor layer, the first semiconductor layer being located in a same layer as the upper interconnection layer.

According to this configuration, the amount of process damage to an oxide semiconductor and a photoelectric conversion film can be minimized and shifts in the characteristics of the oxide semiconductor can be suppressed while avoiding adverse effects upon an area of a circuit or a driving speed. Thus, circuit performance can be improved as a whole.

For example, the upper interconnection layer may be an uppermost layer of the multilayer interconnection structure.

According to this configuration, the process damage can be further suppressed.

The present disclosure may be realized as a semiconductor integrated circuit (large-scale integration; LSI) including some or all of functions of such a solid-state imaging device or may be realized as a solid-state image capture apparatus (camera) including such a solid-state imaging device.

Embodiments will be specifically described hereinafter with reference to the drawings.

The embodiments that will be described hereinafter all indicate specific examples of the present disclosure. Values, shapes, materials, components, positions at which the components are arranged, modes in which the components are connected to one another, steps, order of the steps, and the like that will be mentioned in the following embodiments are examples and are not intended to limit the present disclosure. In addition, among the components that will be mentioned in the following embodiments, components that are not described in an independent claim, which defines a broadest concept, are described as arbitrary components.

First Embodiment

In a solid-state imaging device according to a first embodiment, a charge storage capacitance is electrically insulated from a semiconductor substrate. As a result, leakage current in the charge storage capacitance is reduced.

First, an overall configuration of the solid-state imaging device will be described. FIG. 1 is a block diagram illustrating the configuration of the solid-state imaging device according to this embodiment.

A solid-state imaging device 100 illustrated in FIG. 1 includes a plurality of pixels (unit pixel cells) 101 arranged in a matrix, a vertical scanning unit 102, a plurality of column signal processing units 103, each of which is provided for each column, a horizontal reading unit 104, a plurality of reset control lines 105, each of which is provided for each row, a plurality of address control lines 106, each of which is provided for each row, a plurality of vertical signal lines 107, each of which is provided for each column, and a horizontal output terminal 108. At least one of the plurality of pixels 101 corresponds to a unit pixel cell in the present disclosure. The plurality of pixels 101 may include one or more pixels which do not correspond to the unit pixel cell in the present disclosure. Also each of the plurality of pixels 101 may correspond to the unit pixel cell in the present disclosure.

Each of the plurality of pixels 101 outputs a signal according to incident light to the vertical signal line 107 provided in a corresponding column.

The vertical scanning unit 102 resets the plurality of pixels 101 through the plurality of reset control lines 105. In addition, the vertical scanning unit 102 sequentially selects the plurality of pixels 101 in units of rows through the plurality of address control lines 106.

Each of the plurality of column signal processing units 103 performs signal processing on signals output to the vertical signal line 107 provided in a corresponding column and outputs signals obtained as a result of the signal processing to the horizontal reading unit 104. For example, each of the plurality of column signal processing units 103 performs noise suppression signal processing typified by correlated double sampling, analog-to-digital conversion processing, and the like.

The horizontal reading unit 104 sequentially outputs a plurality of signals subjected to the signal processing performed by the plurality of column signal processing units 103 to the horizontal output terminal 108.

Figure 2:
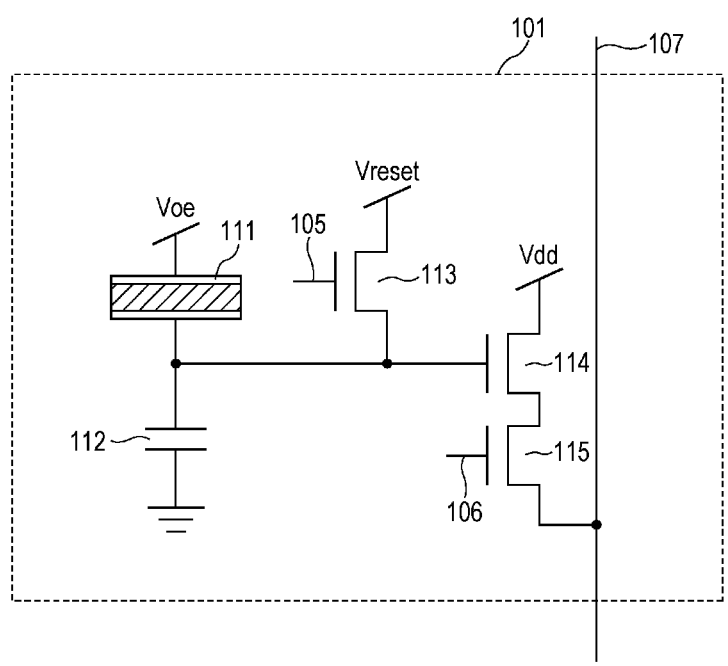
FIG. 2 is a circuit diagram illustrating a pixel according to the first embodiment.

The configuration of each pixel 101 will be described hereinafter. FIG. 2 is a circuit diagram illustrating the configuration of each pixel 101.

As illustrated in FIG. 2, the pixel 101 includes a photoelectric conversion unit 111, a charge storage capacitance 112, a reset transistor 113, an amplifying transistor (source follower transistor) 114, and a selection transistor 115. The amplifying transistor 114 is an example of a charge detection transistor in the present disclosure. The reset transistor 113 is an example of a reset transistor in the present disclosure.

The photoelectric conversion unit 111 generates signal charge by performing photoelectric conversion on incident light. Voltage Voe is applied to an end of the photoelectric conversion unit 111.

The charge storage capacitance 112 is connected to the photoelectric conversion unit 111 and accumulates signal charge generated by the photoelectric conversion unit 111. In this embodiment, the charge storage capacitance 112 is configured not by a dedicated capacitor but by parasitic capacitance such as interconnection capacitance. The charge storage capacitance 112 may further include a dedicated capacitor. Also the charge storage capacitance 112 may be configured by a dedicated capacitor.

The reset transistor 113 is used for resetting the potential of signal charge. A gate of the reset transistor 113 is connected to the reset control line 105, and a source of the reset transistor 113 is connected to the charge storage capacitance 112. Reset voltage Vreset is applied to a drain of the reset transistor 113.

Definitions of a drain and a source generally depend on their operations in a circuit, and it is often difficult to identify a drain and a source from a device structure. In this embodiment, either a source or a drain will be referred to as a "source" and the other of the source and the drain will be referred to as a "drain" for the sake of convenience, but the "drain" in this embodiment may be regarded as the source, and the "source" in this embodiment may be regarded as the drain, instead.

In this embodiment, the reset transistor 113 is composed of an oxide semiconductor (for example, InGaZnO).

The amplifying transistor 114 amplifies the voltage of the charge storage capacitance 112 and outputs a signal according to the voltage to the vertical signal lines 107. A gate of the amplifying transistor 114 is connected to the charge storage capacitance 112, and power supply voltage Vdd or ground voltage Vss is applied to a drain of the amplifying transistor 114.

The selection transistor 115 is connected in series with the amplifying transistor 114 and determines whether to output the signal amplified by the amplifying transistor 114 to the vertical signal line 107. A gate of the selection transistor 115 is connected to the address control line 106, a drain of the selection transistor 115 is connected to a source of the amplifying transistor 114, and a source of the selection transistor 115 is connected to the vertical signal line 107.

For example, the voltage Voe, the reset voltage Vreset, and the power supply voltage Vdd are each common to all the pixels 101.

Figure 3:
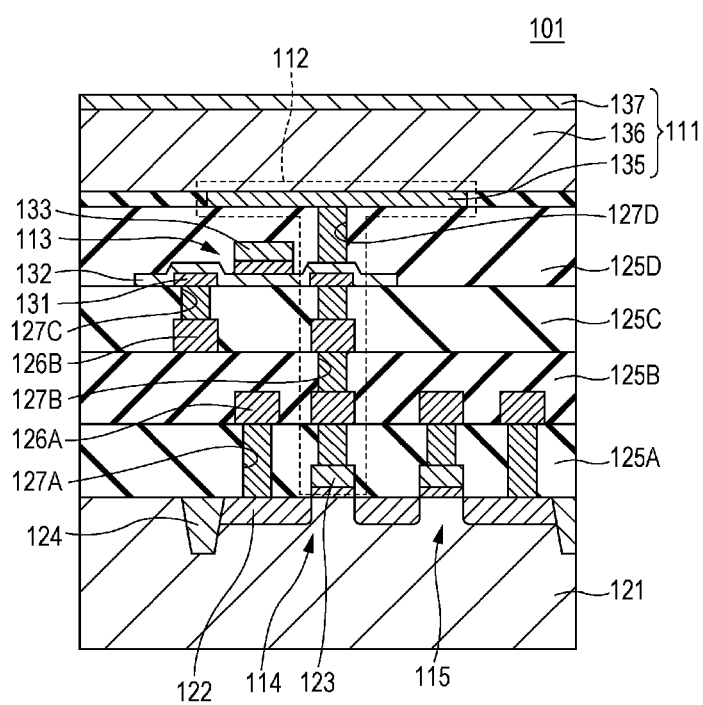
FIG. 3 is a cross-sectional view of the pixel according to the first embodiment.

Next, a cross-sectional structure of each pixel 101 will be described. FIG. 3 is a cross-sectional view of each pixel 101.

As illustrated in FIG. 3, each pixel 101 includes a semiconductor substrate 121, diffusion layers 122, gate electrodes 123, device isolation regions 124, insulating layers 125A to 125D, interconnection layers 126A and 126B, and contacts (contact holes) 127A to 127D.

The semiconductor substrate 121 is, for example, a silicon substrate. The amplifying transistor 114 and the selection transistor 115 are formed on the semiconductor substrate 121.

The amplifying transistor 114 and the selection transistor 115 each include two diffusion layers 122, which are the source and the drain, respectively, and a gate electrode 123.

The diffusion layers 122 are formed in the semiconductor substrate 121. The gate electrodes 123 are formed on the semiconductor substrate 121 through gate insulating films.

The device isolation regions 124 are formed in the semiconductor substrate 121 to isolate the transistors of the corresponding pixel 101 from those of adjacent pixels 101. Although an example in which shallow trench isolation (STI) is adopted in order to isolate devices from each other, p-n junction isolation or the like may be adopted, instead.

The insulating layer 125A is formed on the semiconductor substrate 121 in such a way as to cover the amplifying transistor 114 and the selection transistor 115.

The interconnection layer 126A is formed on the insulating layer 125A. The contacts 127A are formed in the insulating layer 125A and electrically connect the diffusion layers 122 and the gate electrodes 123 to the interconnection layer 126A. The insulating layer 125B is formed on the insulating layer 125A in such a way as to cover the interconnection layer 126A.

The interconnection layer 126B is formed on the insulating layer 125B. The contact 127B is formed in the insulating layer 125B and electrically connects the interconnection layer 126A to the interconnection layer 126B. The insulating layer 125C is formed on the insulating layer 125B in such a way as to cover the interconnection layer 126B.

The reset transistor 113 is formed on the insulating layer 125C. In this embodiment, the reset transistor 113 is composed of an oxide semiconductor and formed outside (above) the semiconductor substrate 121. The reset transistor 113 includes two electrodes 131, which are the source and the drain, respectively, an oxide semiconductor layer 132, and a gate electrode 133.

The two electrodes 131 are formed on the insulating layer 125C. The contacts 127C are formed in the insulating layer 125C and electrically connect the interconnection layer 126B to the electrodes 131.

The oxide semiconductor layer 132 is formed on the insulating layer 125C and the two electrodes 131. The oxide semiconductor layer 132 is composed, for example, of InGaZnO.

The gate electrode 133 is formed on the oxide semiconductor layer 132 through a gate insulating film. In addition, when viewed from above, that is, when viewed from the direction normal to an upper surface of the semiconductor substrate 121, the gate electrode 133 is arranged between the two electrodes 131.

The insulating layer 125D is formed on the insulating layer 125C in such a way as to cover the reset transistor 113.

The photoelectric conversion unit 111 is formed on the insulating layer 125D. In this embodiment, the photoelectric conversion unit 111 is not formed on the semiconductor substrate 121 but formed outside (above) the semiconductor substrate 121. The photoelectric conversion unit 111 includes a pixel electrode 135, a photoelectric conversion layer 136, and a transparent electrode 137.

The pixel electrode 135 is formed on the insulating layer 125D. The pixel electrode 135 is composed, for example, of a metal having a light blocking effect. For example, the pixel electrode 135 is composed of Ti, TiN, Ta, or Mo.

The photoelectric conversion layer 136 is formed on the pixel electrode 135 and performs photoelectric conversion on incident light. For example, the photoelectric conversion layer 136 includes an organic material. Alternatively, the photoelectric conversion layer 136 may include a layer composed of an organic material and a layer composed of an inorganic material. Alternatively, the photoelectric conversion layer 136 may include only a layer composed of an inorganic material. For example, the photoelectric conversion layer 136 may be composed of amorphous silicon, a chalcopyrite semiconductor, or the like.

The transparent electrode 137 is formed on the photoelectric conversion layer 136 and has light transmitting property. For example, the transparent electrode 137 is composed of indium tin oxide (ITO).

Here, the pixel electrode 135 of each pixel 101 is electrically insulated from one another, but the photoelectric conversion layer 136 and the transparent electrode 137 are formed over the plurality of pixels 101.

The contact 127D is formed in the insulating layer 125D and electrically connects the reset transistor 113 to the pixel electrode 135.

Although an example in which two interconnection layers are provided has been described above, one interconnection layer or three or more interconnection layers may be provided, instead. In addition, although an interconnection layer is not provided between an oxide semiconductor transistor (reset transistor 113) and the photoelectric conversion unit 111 here, an interconnection layer may be provided there, instead.

As described above, the solid-state imaging device 100 according to this embodiment includes the photoelectric conversion unit 111 formed outside the semiconductor substrate 121. In addition, as illustrated in the circuit diagram of FIG. 2, a transfer transistor is not provided between the photoelectric conversion unit 111 and the charge storage capacitance 112. In this configuration, the charge storage capacitance 112 can hold charge for a longer period of time than in a configuration in which a transfer transistor is provided. Therefore, leakage current in the charge storage capacitance 112 significantly affects the characteristics of the solid-state imaging device 100. In the above configuration, an oxide semiconductor transistor composed of an oxide semiconductor is used as the reset transistor 113 in this embodiment. As a result, leakage current can be suppressed more effectively than when a silicon transistor formed on the semiconductor substrate 121 is used as the reset transistor 113. Thus, the solid-state imaging device 100 according to this embodiment can suppress leakage current when the effect of leakage current in the charge storage capacitance 112 is significant.

Furthermore, in the solid-state imaging device 100 according to this embodiment, the charge storage capacitance 112 is not electrically connected to the diffusion layers 122 formed in the semiconductor substrate 121. In other words, the charge storage capacitance 112 is electrically insulated from the semiconductor substrate 121. More specifically, in this embodiment, the charge storage capacitance 112 is configured only by the parasitic capacitance of the pixel electrode 135, the source (electrode 131) of the reset transistor 113, the gate electrode 123 of the amplifying transistor 114, and interconnection (interconnection layers and contacts) between these components.

Here, if a photodiode formed on the semiconductor substrate 121 is used as the photoelectric conversion unit 111, the charge storage capacitance 112 is electrically connected to the semiconductor substrate 121. If a silicon transistor formed on the semiconductor substrate 121 is used as the reset transistor 113, the charge storage capacitance 112 is electrically connected to the diffusion layer 122 (the source of the reset transistor 113) formed in the semiconductor substrate 121. If the capacitance of the diffusion layers 122 formed in the semiconductor substrate 121 is used as the charge storage capacitance 112, the charge storage capacitance 112 is connected to the diffusion layers 122.

On the other hand, in this embodiment, the charge storage capacitance 112 and the semiconductor substrate 121 are electrically insulated from each other by (1) forming the photoelectric conversion unit 111 above the semiconductor substrate 121, (2) using an oxide semiconductor transistor as the reset transistor 113, and (3) not using the capacitance of the diffusion layers 122 as the charge storage capacitance 112. As a result, leakage current in the charge storage capacitance 112 can be sufficiently suppressed.

In addition, in this embodiment, the imaging device (solid-state imaging device 100) includes the unit pixel cells (pixels 101), each including the photoelectric conversion unit 111 that performs photoelectric conversion on incident light, the charge detection transistor (amplifying transistor 114) that is provided on the semiconductor substrate 121 and that detects the signal charge of the photoelectric conversion unit 111, and the reset transistor 113 that initializes the voltage of the photoelectric conversion unit 111. The photoelectric conversion unit 111 includes the pixel electrode 135 and the photoelectric conversion layer 136 arranged on the pixel electrode 135. The pixel electrode 135 is provided above the charge detection transistor (amplifying transistor 114). The reset transistor 113 is provided above the charge detection transistor (amplifying transistor 114) but below the pixel electrode 135.

Thus, the reset transistor 113 and the charge detection transistor (amplifying transistor 114) are vertically aligned with each other. As a result, the area of the imaging device can be reduced.

In addition, the charge detection transistor (amplifying transistor 114), which requires a driving capability to secure gain and whose maximum permissible variation in characteristics thereof is small, is arranged on the semiconductor substrate 121, and the reset transistor 113, which permits relatively large variations in characteristics thereof in terms of the circuit operation, is arranged above the charge detection transistor (amplifying transistor 114) but below the pixel electrode 135. As a result, overall circuit operation characteristics can be secured while keeping the area of the imaging device small.

Thus, the imaging device according to this embodiment can suppress deterioration of the characteristics while reducing the area of the imaging device.

Although an example in which the reset transistor 113 is composed of an oxide semiconductor has been described above, it is sufficient that a semiconductor layer of the reset transistor 113 be mainly composed of an oxide semiconductor. That is, in general, a known oxide semiconductor may be used as the semiconductor layer of the reset transistor 113, and the semiconductor layer of the reset transistor 113 may include a small amount of impurities or a minor constituent that gets mixed therewith during fabrication, insofar as the characteristics of the reset transistor 113 are not affected.

In addition, the oxide semiconductor used for the semiconductor layer of the reset transistor 113 is not limited to InGaZnO. InZnO, InSnZnO, ZnSnO, InWO, or ZnO may be used, instead. Alternatively, the oxide semiconductor may be an oxide material including at least one of the following elements: In, Ga, Zn, Sn, W, Al, Si, Ge, Ti, Ta, and Mg. Alternatively, the oxide semiconductor may be an oxynitride material obtained by adding nitride to the oxide material, that is, for example, an oxynitride material such as ZnON or InGaZnON.

Furthermore, the reset transistor 113 may be composed of a material other than an oxide semiconductor. In this case, the semiconductor layer of the reset transistor 113 may be mainly composed of a semiconductor whose band gap is larger than that of the semiconductor of which the semiconductor substrate 121 is composed. For example, the semiconductor layer of the reset transistor 113 may be mainly composed of a II-VI compound semiconductor. Here, the II-VI compound semiconductor is CdS, CdSe, CdTe, ZnTe, or the like. In this case, too, the semiconductor layer of the reset transistor 113 may include a small amount of impurities or a minor constituent that gets mixed therewith during fabrication, insofar as the characteristics of the reset transistor 113 are not affected.

In addition, as described above, the photoelectric conversion unit 111 is provided above the semiconductor substrate 121 through a multilayer interconnection structure. The multilayer interconnection structure includes a lower interconnection layer and an upper interconnection layer. The semiconductor layer of the reset transistor 113 is provided in a same layer as the upper interconnection layer. Here, the lower interconnection layer is an interconnection layer but lower than the upper interconnection layer. For example, the semiconductor layer of the reset transistor 113 is provided in an uppermost layer of the multilayer interconnection structure.

Here, the characteristics of a semiconductor whose band gap is large, such as an oxide semiconductor, easily shift due to an effect of a heat treatment or diffusion of impurities such as hydrogen. The photoelectric conversion characteristics of a photoelectric conversion film also deteriorate due to a heat treatment of high temperature. On the other hand, interconnections that are used in peripheral circuits and through which current of the order of milliamperes flows need to be subjected to a certain heat treatment, in order to establish current tolerance. Therefore, the reset transistor 113 is desirably arranged in the upper interconnection layer, not the lower interconnection layer, of the multilayer interconnection structure used for the peripheral circuits. As a result, the amount of process damage to the oxide semiconductor and the photoelectric conversion film can be minimized and the shifts in the characteristics of the oxide semiconductor can be suppressed while avoiding adverse effects upon the area of the circuit or the driving speed. Thus, circuit performance can be improved as a whole.

Furthermore, by arranging the reset transistor 113 in a same layer as the uppermost layer of the multilayer interconnection structure, the process damage can be further suppressed.

In addition, as described above, the pixel electrode 135 is composed of a light blocking material. Here, a transistor mainly composed of a semiconductor whose band gap is large, such as an oxide semiconductor layer, is likely to cause shifts in the characteristics thereof when light is radiated thereonto. On the other hand, by covering an active layer as much as possible using a pixel electrode and blocking light, the shifts in the characteristics of the transistor can be suppressed. Thus, the characteristics of the reset transistor 113 can be stabilized.

Second Embodiment

In a second embodiment, a modification of the first embodiment will be described. In the following description, differences from the first embodiment will be mainly described, and redundant description is omitted.

Figure 4:
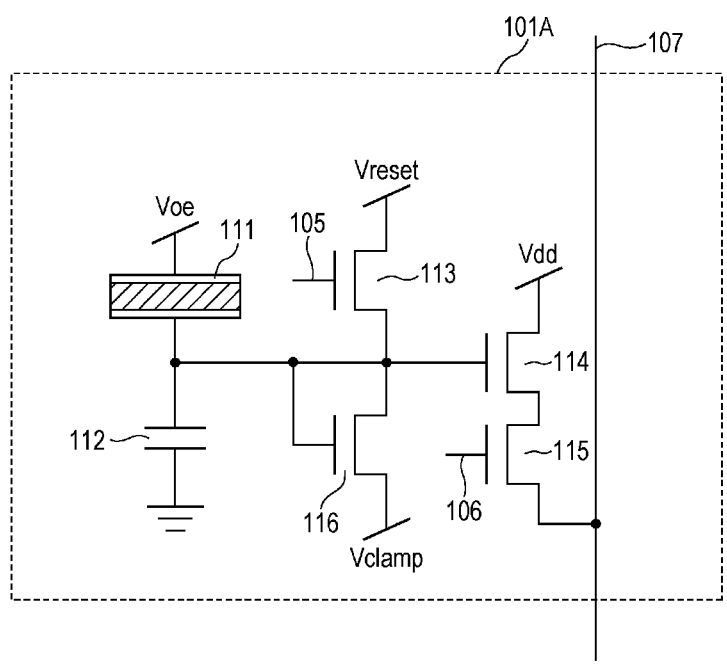
FIG. 4 is a circuit diagram illustrating a pixel according to a second embodiment.

FIG. 4 is a circuit diagram illustrating the configuration of each pixel 101A according to this embodiment. A pixel 101A illustrated in FIG. 4 includes a clamp transistor 116 in addition to the configuration of the pixel 101 illustrated in FIG. 2.

A gate and a drain of the clamp transistor 116 are connected to the charge storage capacitance 112, and clamp voltage Vclamp is applied to a source of the clamp transistor 116. As with the reset transistor 113, the clamp transistor 116 is composed of an oxide semiconductor.

Thus, by providing the clamp transistor 116, it is possible to suppress application of excessive voltage to the amplifying transistor 114, thereby suppressing damage to the amplifying transistor 114.

In addition, by using an oxide semiconductor transistor as the clamp transistor 116, the charge storage capacitance 112 and the semiconductor substrate 121 (diffusion layers 122) are not electrically connected to each other as in the first embodiment. Thus, an increase in leakage current can be suppressed while suppressing damage to the amplifying transistor 114.

Figure 5:
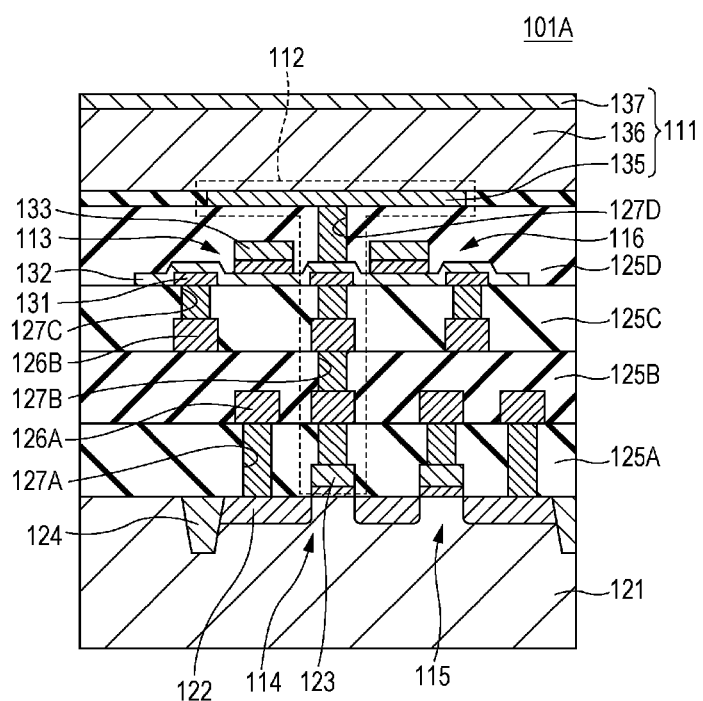
FIG. 5 is a cross-sectional view of the pixel according to the second embodiment.

FIG. 5 is a cross-sectional view of the pixel 101A. As illustrated in FIG. 5, the clamp transistor 116 is formed on the insulating layer 125C. The clamp transistor 116 is composed of an oxide semiconductor and formed outside (above) the semiconductor substrate 121. The configuration of the clamp transistor 116 is the same as that of the reset transistor 113.

As with the semiconductor layer of the reset transistor 113, a semiconductor layer of the clamp transistor 116 may be mainly composed of an oxide semiconductor. For example, the semiconductor layers of the reset transistor 113 and the clamp transistor 116 are provided in the same oxide semiconductor layer. That is, the semiconductor layers of the reset transistor 113 and the clamp transistor 116 are included in a single continuous semiconductor layer.

Furthermore, as with the reset transistor 113, the clamp transistor 116 may be composed of a material other than an oxide semiconductor, instead. In this case, the semiconductor layer of the clamp transistor 116 may be mainly composed of a semiconductor whose band gap is larger than that of the semiconductor of which the semiconductor substrate 121 is composed.

Third Embodiment

In a third embodiment, a modification of the first embodiment will be described.

The circuit configuration of each pixel 101B according to this embodiment is the same as that of each pixel 101 according to the first embodiment illustrated in FIG. 2.

Figure 6:
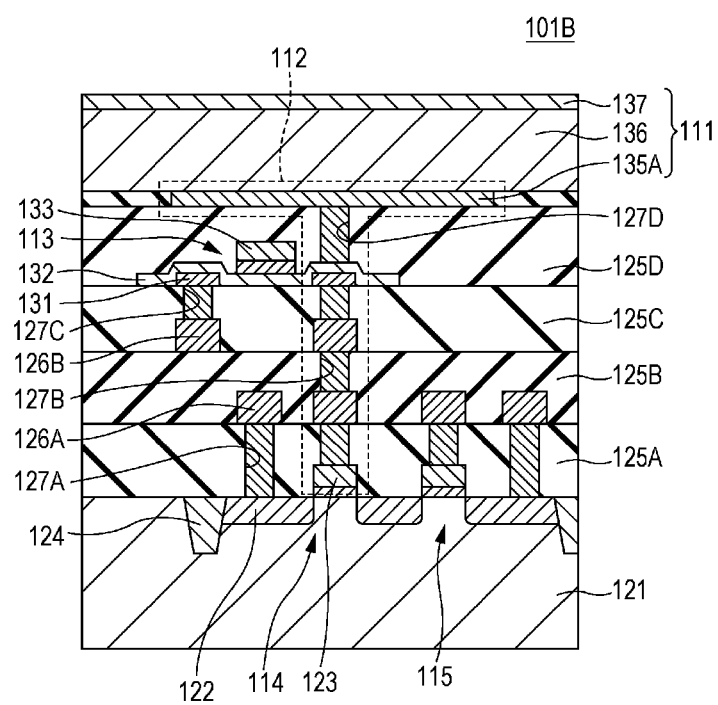
FIG. 6 is a cross-sectional view of a pixel according to a third embodiment.

FIG. 6 is a diagram illustrating a cross-sectional structure of each pixel 101B according to this embodiment. The configuration illustrated in FIG. 6 is different from the configuration illustrated in FIG. 3 in that the size of a pixel electrode 135A is different from that of the pixel electrode 135.

Figure 7:
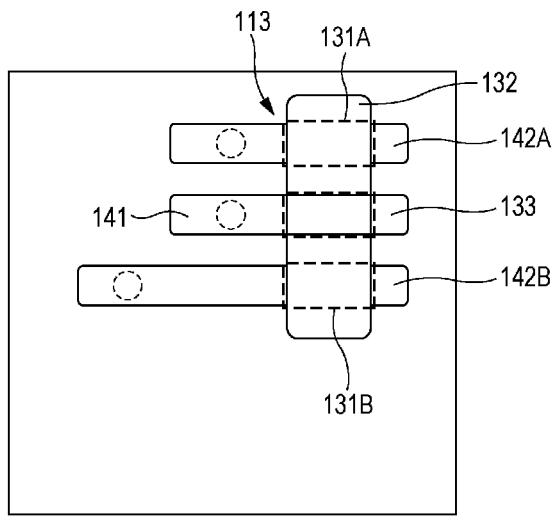
FIG. 7 is a plan view of a reset transistor according to the third embodiment.
Figure 8:
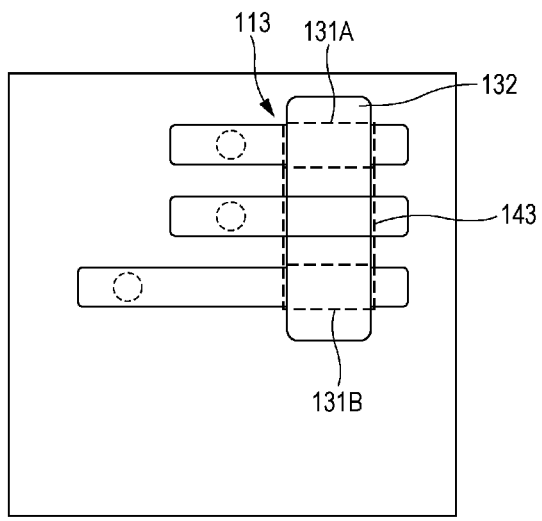
FIG. 8 is a plan view of the reset transistor according to the third embodiment.

FIGS. 7 and 8 are plan views of the reset transistor 113. As illustrated in FIG. 7, when viewed from above, a portion of a gate electrode layer (gate electrode node) 141 in which the gate electrode layer 141 and the oxide semiconductor layer 132 overlap will be referred to as the "gate electrode 133". In addition, when viewed from above, a portion of a drain electrode layer (drain electrode node) 142A in which the drain electrode layer 142A and the oxide semiconductor layer 132 overlap will be referred to as a "drain electrode 131A". In addition, when viewed from above, a portion of a source electrode layer (source electrode node) 142B in which the source electrode layer 142B and the oxide semiconductor layer 132 overlap will be referred to as a "source electrode 131B".

In addition, as illustrated in FIG. 8, when viewed from above, a region of the oxide semiconductor layer 132 located between the drain electrode 131A and the source electrode 131B will be referred to as a "charge transport region 143".

Figure 9:
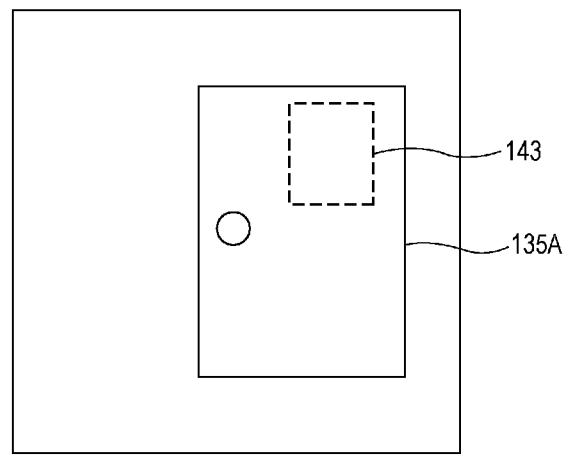
FIG. 9 is a plan view of a pixel electrode according to the third embodiment.

FIG. 9 is a plan view of the charge transport region 143 and the pixel electrode 135A. In this embodiment, the pixel electrode 135A is formed above the reset transistor 113 and, when viewed from above, covers the entirety of the charge transport region 143 as illustrated in FIG. 9.

The pixel electrode 135A is composed of a metal having a light blocking effect. For example, the pixel electrode 135A is composed of Ti, TiN, Ta, or Mo.

As a result, since the pixel electrode 135A blocks incident light, it is possible to suppress entry of incident light into the charge transport region 143 of the reset transistor 113. Therefore, it is possible to suppress variation in threshold voltage of the reset transistor 113 due to incident light. As a result, since variation and temporal changes in the operation of the pixels 101B can be suppressed, reliability improves.

Figure 10:
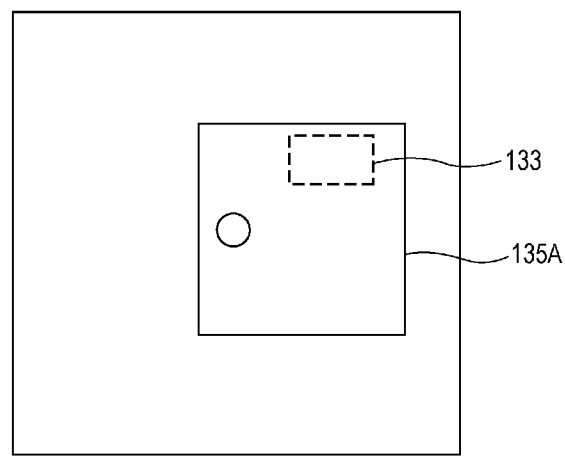
FIG. 10 is a plan view of a pixel electrode according to a modification of the third embodiment.

Alternatively, as illustrated in FIG. 10, when viewed from above, the pixel electrode 135A may be formed in such a way as to cover the entirety of the gate electrode 133. In other words, the pixel electrode 135A may be formed in such a way as to cover only part of the charge transport region 143. In this case, too, the effect of incident light upon the reset transistor 113 can be reduced.

Figure 11:
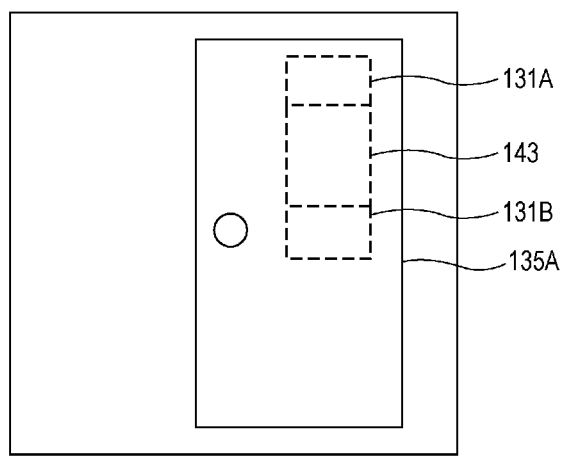
FIG. 11 is a plan view of a pixel electrode according to a modification of the third embodiment.

Alternatively, as illustrated in FIG. 11, when viewed from above, the pixel electrode 135A may be formed in such a way as to cover the entirety of the charge transport region 143, the drain electrode 131A, and the source electrode 131B. In this configuration, the effect of incident light upon the reset transistor 113 can be further reduced.

Fourth Embodiment

In this embodiment, a case in which the configuration according to the third embodiment is applied to each pixel 101A according to the second embodiment will be described.

The circuit configuration of each pixel 101C according to this embodiment is the same as that of each pixel 101A according to the second embodiment illustrated in FIG. 4.

Figure 12:
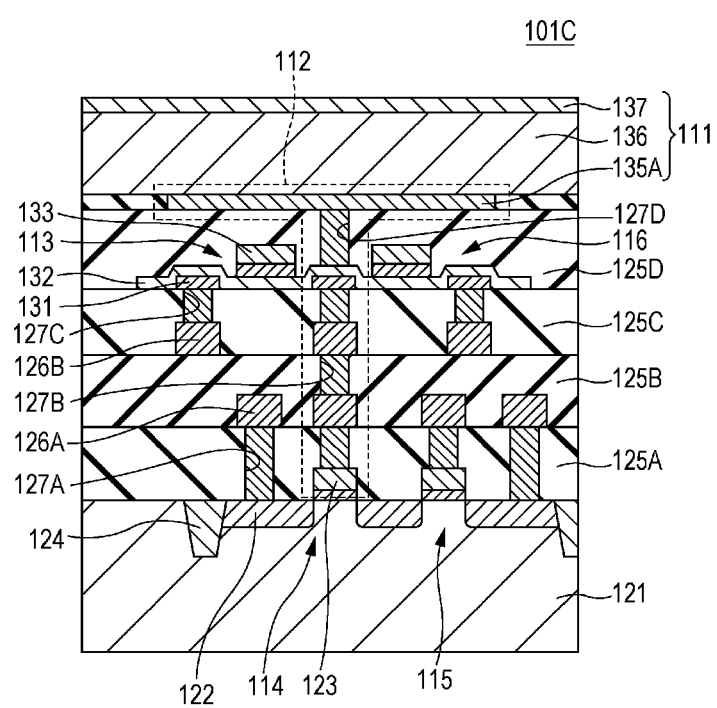
FIG. 12 is a cross-sectional view of a pixel according to a fourth embodiment.

FIG. 12 is a diagram illustrating a cross-sectional structure of each pixel 101C according to this embodiment. The configuration illustrated in FIG. 12 is different from the configuration illustrated in FIG. 5 in that the size of the pixel electrode 135A is different from that of the pixel electrode 135.

Figure 13:
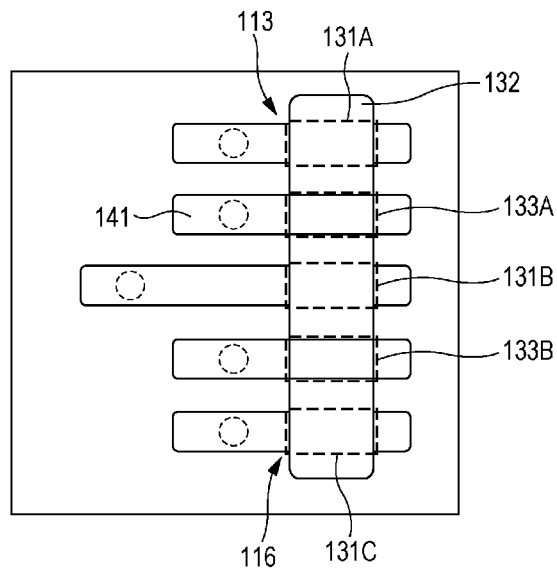
FIG. 13 is a plan view of a reset transistor and a clamp transistor according to the fourth embodiment.
Figure 14:
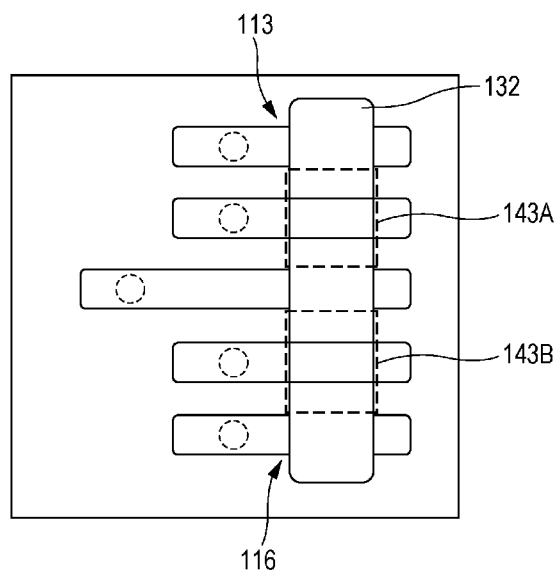
FIG. 14 is a plan view of the reset transistor and the clamp transistor according to the fourth embodiment.

FIGS. 13 and 14 are plan views of the reset transistor 113 and the clamp transistor 116. In the following description, as illustrated in FIG. 13, the gate electrode 133 of the reset transistor 113 will be referred to as a "gate electrode 133A", and the gate electrode 133 of the clamp transistor 116 will be referred to as a "gate electrode 133B". The drain electrode of the reset transistor 113 will be referred to as the "drain electrode 131A", the source electrode of the reset transistor 113 will be referred to as the "source electrode 131B", and the source electrode of the clamp transistor 116 will be referred to as a "source electrode 131C". The drain electrode of the clamp transistor 116 is integrally formed with the source electrode 131B of the reset transistor 113. In other words, the source electrode 131B is the drain electrode of the clamp transistor 116. Alternatively, the drain electrode of the clamp transistor 116 may be formed independently of the source electrode 131B of the reset transistor 113.

As illustrated in FIG. 14, the charge transport region 143 of the reset transistor 113 will be referred to as a "charge transport region (first charge transport region) 143A", and the charge transport region 143 of the clamp transistor 116 will be referred to as a "charge transport region (second charge transport region) 143B".

Figure 15:
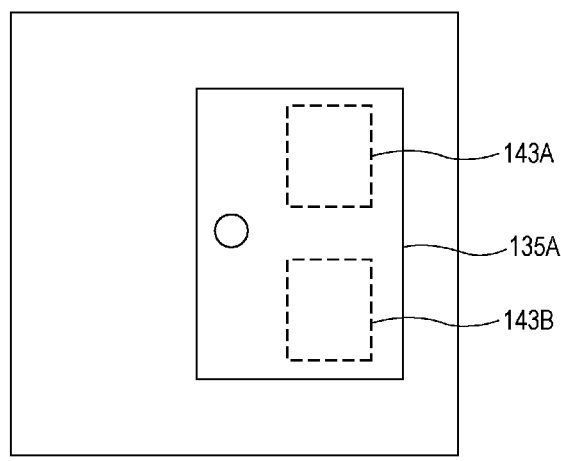
FIG. 15 is a plan view of a pixel electrode according to the fourth embodiment.

FIG. 15 is a plan view of the charge transport regions 143A and 143B and the pixel electrode 135A. In this embodiment, the pixel electrode 135A is formed above the reset transistor 113 and the clamp transistor 116 and, when viewed from above, covers the entirety of the charge transport regions 143A and 143B as illustrated in FIG. 15.

The pixel electrode 135A is composed of a metal having a light blocking effect. For example, the pixel electrode 135A is composed of Ti, TiN, Ta, or Mo.

As a result, since the pixel electrode 135A blocks incident light, it is possible to suppress entry of incident light into the charge transport region 143A of the reset transistor 113 and the charge transport region 143B of the clamp transistor 116. Therefore, it is possible to suppress variation in the threshold voltage of the reset transistor 113 and the clamp transistor 116 due to incident light. As a result, since variation in the operating characteristic and temporal changes of the pixels 101C are suppressed, reliability improves.

Figure 16:
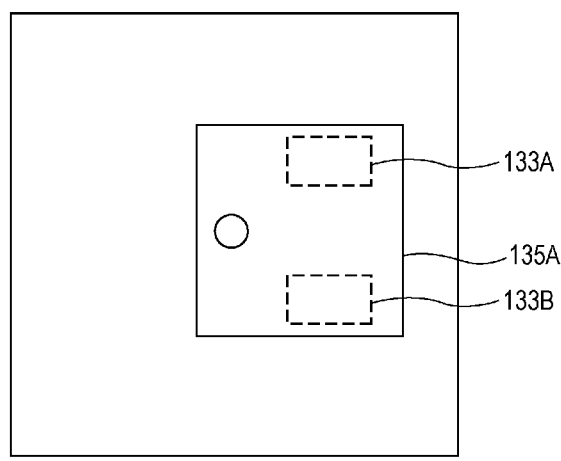
FIG. 16 is a plan view of a pixel electrode according to a modification of the fourth embodiment.

Alternatively, as illustrated in FIG. 16, when viewed from above, the pixel electrode 135A may be formed in such a way as to cover the entirety of the gate electrode 133A and the gate electrode 133B. In other words, the pixel electrode 135A may be formed in such a way as to cover only part of the charge transport region 143A and part of the charge transport region 143B. In this case, too, the effect of incident light upon the reset transistor 113 and the clamp transistor 116 can be reduced.

Figure 17:
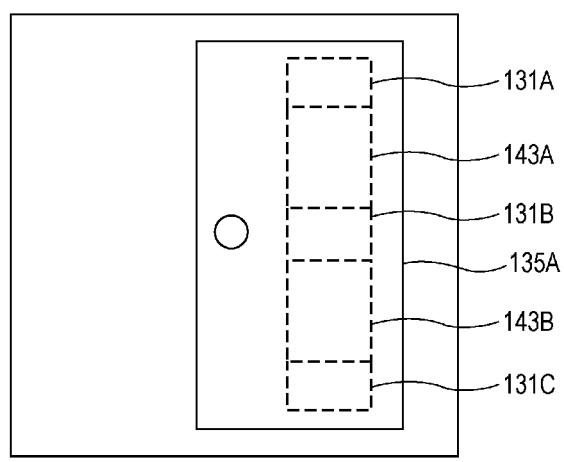
FIG. 17 is a plan view of a pixel electrode according to a modification of the fourth embodiment.

Alternatively, as illustrated in FIG. 17, when viewed from above, the pixel electrode 135A may be formed in such a way as to cover the entirety of the charge transport regions 143A and 143B, the drain electrode 131A, and the source electrodes 131B and 131C. In this configuration, the effect of incident light upon the reset transistor 113 and the clamp transistor 116 can be further reduced.

In addition, a region covered by the pixel electrode 135A may be different between the reset transistor 113 and the clamp transistor 116. For example, the pixel electrode 135A may be formed in such a way as to cover the entirety of the charge transport region 143A of the reset transistor 113 and the entirety of the gate electrode 133B of the clamp transistor 116. Alternatively, the above configuration may be applied to only either the reset transistor 113 or the clamp transistor 116. In other words, the pixel electrode 135A may be formed in such a way as to cover a region (a region including at least the gate electrode, the charge transport region, the source electrode, or the drain electrode) of only either the reset transistor 113 or the clamp transistor 116.

Fifth Embodiment

In a fifth embodiment, a modification of the fourth embodiment will be described.

Figure 18:
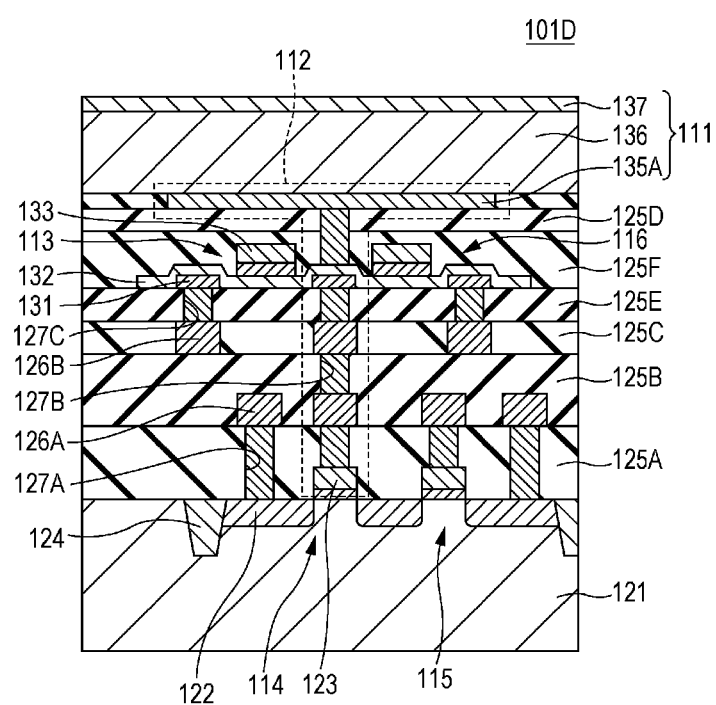
FIG. 18 is a cross-sectional view of a pixel according to a fifth embodiment.

FIG. 18 is a cross-sectional view of each pixel 101D according to this embodiment. As illustrated in FIG. 18, each pixel 101D includes insulating layers 125E and 125F in addition to the configuration of each pixel 101C illustrated in FIG. 12.

The insulating layer 125E is formed on the insulating layer 125C. The reset transistor 113 and the clamp transistor 116 are formed on the insulating layer 125E. The insulating layer 125F is formed on the insulating layer 125E in such a way as to cover the reset transistor 113 and the clamp transistor 116. The insulating layers 125E and 125F are composed of a silicon nitride. The insulating layers 125A to 125D are composed, for example, of a silicon oxide.

In the above configuration, the oxide semiconductor transistor is wrapped by layers of silicon nitride films. As a result, diffusion of impurities (hydrogen or the like) to the oxide semiconductor layer 132 from upper and lower layers can be suppressed. Therefore, variation in the threshold voltage of the reset transistor 113 and the clamp transistor 116 can be suppressed. As a result, reliability in device operation improves.

The material of the insulating layers 125A to 125D is not limited to a silicon oxide. Some layers may be composed of a silicon nitride, instead.

Although a configuration in which the insulating layers 125E and 125F are provided for the configuration according to fourth embodiment has been described above, the same configuration may be applied to the configurations according to the first to third embodiments, instead.

Sixth Embodiment

In a sixth embodiment, a modification of the first embodiment will be described. In the following description, differences from the first embodiment will be mainly described, and redundant description is omitted.

A solid-state imaging device according to this embodiment includes a diode connected to the charge storage capacitance 112. As a result, it is possible to suppress an excessive increase in the voltage of the charge storage capacitance 112.

Figure 19:
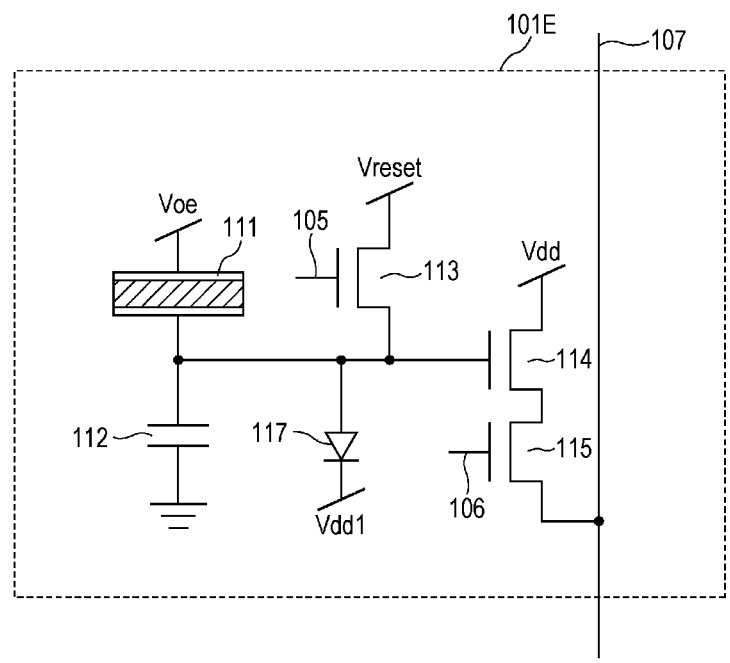
FIG. 19 is a circuit diagram illustrating a pixel according to a sixth embodiment.

The configuration of each pixel 101E will be described hereinafter. FIG. 19 is a circuit diagram illustrating the configuration of each pixel 101E.

As illustrated in FIG. 19, each pixel 101E includes a diode 117 in addition to the configuration of each pixel 101 illustrated in FIG. 2.

An anode of the diode 117 is connected to the charge storage capacitance 112, and voltage Vdd1 is applied to a cathode of the diode 117. The voltage Vdd1 determines a maximum voltage of the charge storage capacitance 112. More specifically, if the voltage of the charge storage capacitance 112 reaches the sum of the voltage Vdd1 and the forward voltage of the diode 117, current flows from the charge storage capacitance 112 to a voltage line to which the voltage Vdd1 is applied. As a result, it is possible to prevent an excessive increase in the voltage of the charge storage capacitance 112.

For example, the voltage Voe, the reset voltage Vreset, the power supply voltage Vdd, and the voltage Vdd1 are each common to all the pixels 101E.

Figure 20:
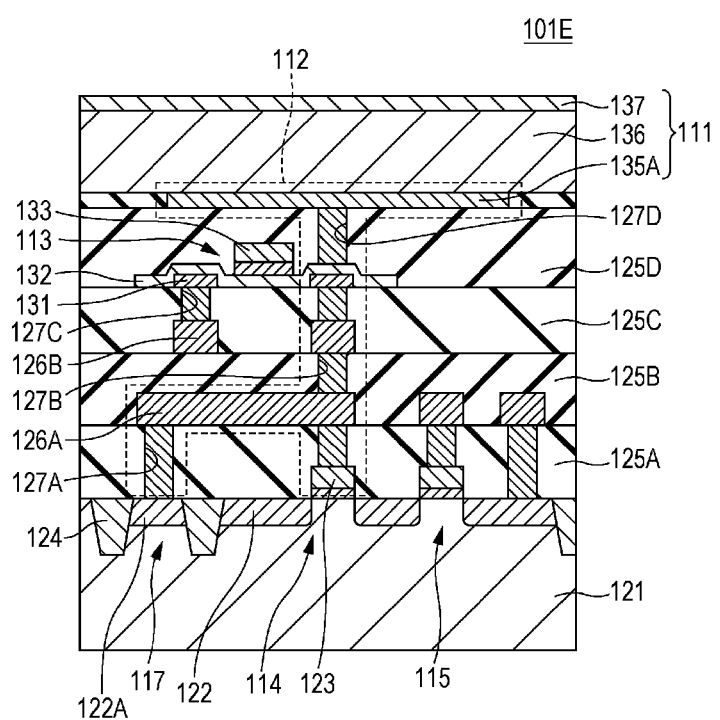
FIG. 20 is a cross-sectional view of the pixel according to the sixth embodiment.

Next, a cross-sectional structure of each pixel 101E will be described. FIG. 20 is a cross-sectional view of each pixel 101E.

The diode 117 includes a diffusion layer 122A formed in the semiconductor substrate 121. For example, the semiconductor substrate 121 is of an n-type, and the diffusion layers 122 and 122A are of a p-type.

The device isolation regions 124 are formed in the semiconductor substrate 121 to isolate the transistors 114 and 115 and the diode 117 from each other. The device isolation regions 124 also isolate the transistors 114 and 115 and the diode 117 of the corresponding pixel 101E from the transistors 114 and 115 and the diodes 117 of adjacent pixels 101E. Although an example in which STI is adopted in order to isolate devices from each other is described here, p-n junction isolation or the like may be adopted, instead.

The interconnection layer 126A is formed on the insulating layer 125A. The contacts 127A are formed in the insulating layer 125A and electrically connect the diffusion layers 122 and 122A and the gate electrode 123 to the interconnection layer 126A. The insulating layer 125B is formed on the insulating layer 125A in such a way as to cover the interconnection layer 126A.

The charge storage capacitance 112 is configured by the parasitic capacitance of the pixel electrode 135, the source (electrode 131) of the reset transistor 113, the gate electrode 123 of the amplifying transistor 114, the diode 117 (diffusion layer 122A), and interconnection (interconnection layers and contacts) between these components.

As described above, the solid-state imaging device 100 according to this embodiment includes the photoelectric conversion unit 111 formed outside the semiconductor substrate 121. In addition, as illustrated in the circuit diagram of FIG. 19, a transfer transistor is not provided between the photoelectric conversion unit 111 and the charge storage capacitance 112. In this configuration, the charge storage capacitance 112 can hold charges for a longer period of time than in a configuration in which a transfer transistor is provided. Therefore, leakage current in the charge storage capacitance 112 significantly affects the characteristics of the solid-state imaging device 100. In the above configuration, an oxide semiconductor transistor composed of an oxide semiconductor is used as the reset transistor 113 in this embodiment. As a result, leakage current can be suppressed more effectively than when a silicon transistor formed on the semiconductor substrate 121 is used as the reset transistor 113. Thus, the solid-state imaging device 100 according to this embodiment can suppress leakage current when the effect of leakage current in the charge storage capacitance 112 is significant.

Furthermore, in the solid-state imaging device 100 according to this embodiment, the charge storage capacitance 112 is electrically connected to the diode 117 formed in the semiconductor substrate 121. Thus, it is possible to prevent an excessive increase in the voltage of the charge storage capacitance 112 and damage to devices (for example, the amplifying transistor 114) connected to the charge storage capacitance 112.

Although an example in which the anode of the diode 117 is connected to the charge storage capacitance 112 has been described above, the cathode of the diode 117 may be connected to the charge storage capacitance 112, instead. In other words, it is only sufficient that the charge storage capacitance 112 be electrically connected to the diffusion layer 122A formed in the semiconductor substrate 121. In this case, too, if a voltage higher than break voltage of the diode 117 is applied to the diode 117, current flows to the diode 117. As a result, it is possible to suppress an excessive increase in the voltage of the charge storage capacitance 112. The anode refers to a p-type semiconductor included in the diode 117, and the cathode refers to an n-type semiconductor included in the diode 117.

Figure 21:
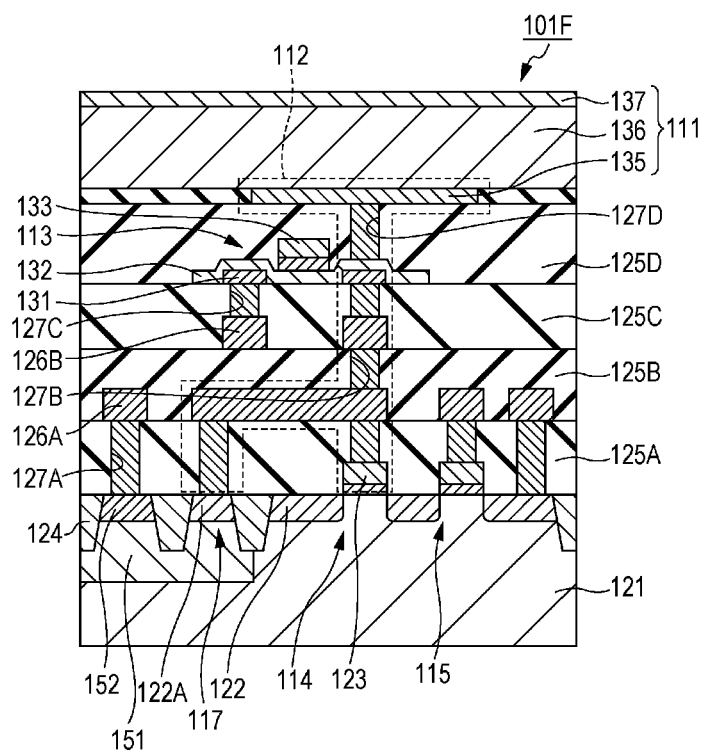
FIG. 21 is a cross-sectional view of a pixel according to a modification of the sixth embodiment.

Although an example in which the diffusion layer 122A included in the diode 117 is directly formed in the semiconductor substrate 121 has been described above, the diffusion layer 122A may be formed in a well 151, instead, as illustrated in FIG. 21. That is, the diode 117 may include the diffusion layer 122A and the semiconductor substrate 121, or may include the diffusion layer 122A and the well 151. In either case, the diffusion layer 122A constitutes part of the diode 117.

A pixel 101F illustrated in FIG. 21 includes the well 151 and a well contact 152 in addition to the configuration illustrated in FIG. 20. The well 151 is formed in the semiconductor substrate 121. The diffusion layer 122A is formed in the well 151. The well contact 152 is a diffusion layer formed in the well 151. The voltage Vdd1 illustrated in FIG. 19 is applied to the well contact 152. For example, the semiconductor substrate 121 is of the p-type, the well 151 is of the n-type, the diffusion layer 122A is of the p-type, and the well contact 152 is of the n-type. That is, the well 151 is of a first conductivity type, and the diffusion layer 122A is of a second conductivity type, whose polarity is opposite that of the first conductivity type.

Although an example in which the silicon transistors (the amplifying transistor 114 and the selection transistor 115) are directly formed on the semiconductor substrate 121 is illustrated in FIG. 21, the silicon transistors may be formed in a well formed in the semiconductor substrate 121. In this case, the well in which the silicon transistors are formed and the well 151 in which the diode 117 is formed are isolated from each other.

As a result of the above configuration, even if the diode 117 is formed, the silicon transistors (the amplifying transistor 114 and the selection transistor 115) of any polarity (n-type or p-type) can be used. In addition, the voltage of the well 151 in which the diode 117 is formed can be controlled independently of the voltage of the semiconductor substrate 121 (or a well) in which the silicon transistors are formed.

As a result, since the arbitrary voltage Vdd1 can be applied to the cathode of the diode 117, the maximum value of the voltage of the charge storage capacitance 112 can be arbitrarily set.

Figure 22:
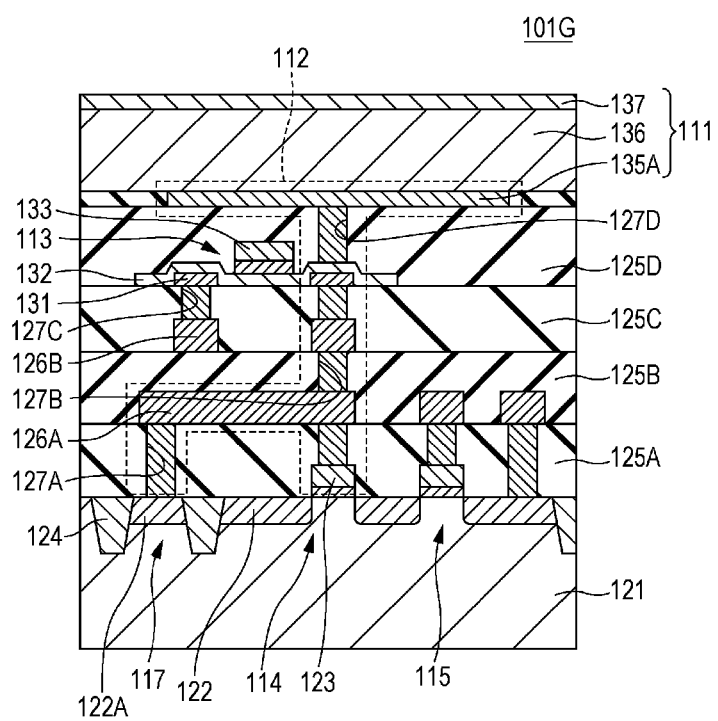
FIG. 22 is a cross-sectional view of a pixel according to a modification of the sixth embodiment.

Alternatively, as in a pixel 101G illustrated in FIG. 22, the same modification as for the third embodiment may be applied to the configuration according to this embodiment. Alternatively, the same modification as for the fifth embodiment may be applied to the configuration according to this embodiment.

Although the solid-state imaging devices according to the embodiments of the present disclosure have been described above, the present disclosure is not limited to the embodiments.

For example, the solid-state imaging device according to each of the embodiments is realized by large-scale integration (LSI), which is typically an integrated circuit. Alternatively, part of a processing unit included in the solid-state imaging device may be realized as a chip.

In addition, the above cross-sectional views and plan views schematically illustrate the configurations according to the embodiments. For example, although corners and sides of each component are expressed by straight lines in the above cross-sectional views and plan views, components having round corners and sides are also included in the present disclosure.

In addition, the circuit configurations illustrated in the above circuit diagrams are examples, and the present disclosure is not limited to the above circuit configurations. That is, circuits capable of realizing the characteristic functions of the present disclosure as with the above configurations are also included in the present disclosure. For example, a circuit in which a device such has a switching device (transistor), a resistor, or a capacitor is connected in series with or parallel to a certain device while maintaining the capability of realizing the same functions as those of the above circuit configurations is also included in the present disclosure. In other words, the term "connected" in the above embodiments refers not only to a case in which two terminals (nodes) are directly connected to each other but also to a case in which two terminals (nodes) are connected to each other through a device while maintaining the capability of realizing the same functions as those of the above circuit configurations.

The values used in the above description are all examples for specifically describing the present disclosure, and the present disclosure is not limited to these examples of values. In addition, the types of transistors, namely the n-type and the p-type, are examples for specifically describing the present disclosure. The same results can be obtained even if the types of transistors are reversed. In addition, the materials of the components described above are examples for specifically describing the present disclosure, and the present disclosure is not limited to these examples of materials.

In addition, the division into the functional blocks in the block diagram is an example. A plurality of functional blocks may be realized as a functional block, a functional block may be divided into a plurality of functional blocks, or the function of a functional block may be transferred to another functional block, instead. Alternatively, the functions of a plurality of functional blocks having similar functions may be processed in parallel with one another or in a time division manner by a single piece of hardware or software.

Although the solid-state imaging device according to one or a plurality of aspects has been described on the basis of the embodiments, the present disclosure is not limited to the embodiments. Modes obtained by modifying the embodiments in various ways that can be conceived by those skilled in the art or modes constructed by combining components in different embodiments are also included in the one or plurality of aspects, insofar as the scope of the present disclosure is not deviated from.

The present disclosure can be applied to a solid-state imaging device. In addition, the present disclosure can be applied to an image capture apparatus, such as a digital still camera or a digital video camera, including a solid-state imaging device.

What is claimed is:

1. An imaging device comprising:
   a semiconductor substrate; and
   a unit pixel cell including:
      a photoelectric converter that includes a pixel electrode and a photoelectric conversion layer on the pixel electrode, the photoelectric converter converting incident light into charge, the photoelectric converter being located over a surface of the semiconductor substrate;
      a charge detection transistor that includes a part of the semiconductor substrate and detects the charge; and
      a reset transistor that includes a first gate electrode and initializes a voltage of the photoelectric converter, wherein
   the pixel electrode is above the charge detection transistor,
   in a cross section vertical to the surface of the semiconductor substrate, the reset transistor is between the charge detection transistor and the pixel electrode, and
   when viewed from a direction normal to the surface of the semiconductor substrate, the pixel electrode covers an entire portion of the first gate electrode.

2. The imaging device according to claim 1, further comprising a first semiconductor layer over the surface of the semiconductor substrate, wherein
   the part of the semiconductor substrate comprises a first semiconductor material,
   the reset transistor includes at least a part of the first semiconductor layer, the at least the part of the first semiconductor layer comprising a second semiconductor material, and
   a band gap of the second semiconductor material is larger than a band gap of the first semiconductor material.

3. The imaging device according to claim 1, wherein
   the reset transistor includes a first source electrode and a first drain electrode, and
   the charge detection transistor is connected to the pixel electrode and one of the first source electrode and the first drain electrode.

4. The imaging device according to claim 1, further comprising a first semiconductor layer over the surface of the semiconductor substrate, wherein
   the reset transistor includes a first source electrode, a first drain electrode, and a charge transport region that is a region of the first semiconductor layer located between the first source electrode and the first drain electrode, and
   when viewed from the direction normal to the surface of the semiconductor substrate, the pixel electrode covers an entire portion of the first charge transport region.

5. The imaging device according to claim 4, wherein, when viewed from the direction normal to the surface of the semiconductor substrate, the pixel electrode covers the first source electrode and the first drain electrode.

6. The imaging device according to claim 1, further comprising a first semiconductor layer over the surface of the semiconductor substrate, wherein
   the part of the semiconductor substrate comprises a first semiconductor material,
   the unit pixel cell further includes:
      a charge storage capacitance that accumulates at least a part of the charge; and
      a clamp transistor between the charge detection transistor and the pixel electrode, the clamp transistor including a second source electrode, a second drain electrode, a second gate electrode, and at least a part of the first semiconductor layer, the at least the part of the first semiconductor layer comprising a second semiconductor material, the second gate electrode and one of the second source electrode and the second drain electrode being connected to the charge storage capacitance, and
   a band gap of the second semiconductor material is larger than a band gap of the first semiconductor material.

7. The imaging device according to claim 6, further comprising a second semiconductor layer over the surface of the semiconductor substrate, wherein
   the reset transistor includes at least a part of the second semiconductor layer, the at least the part of the second semiconductor layer comprising a third semiconductor material, a band gap of the third semiconductor material being larger than the band gap of the first semiconductor material, and
   the first semiconductor layer and the second semiconductor layer are a single continuous semiconductor layer.

8. The imaging device according to claim 6, wherein, when viewed from the direction normal to the surface of the semiconductor substrate, the pixel electrode covers an entire portion of the second gate electrode.

9. The imaging device according to claim 8, wherein, when viewed from the direction normal to the surface of the semiconductor substrate, the pixel electrode covers an entire portion of a charge transport region that is a region of the first semiconductor layer between the second source electrode and the second drain electrode.

10. The imaging device according to claim 9, wherein, when viewed from the direction normal to the surface of the semiconductor substrate, the pixel electrode covers an entire portion of both the second source electrode and the second drain electrode.

11. The imaging device according to claim 1, further comprising a first semiconductor layer over the surface of the semiconductor substrate, wherein
   the photoelectric converter is located over the surface of the semiconductor substrate through a multilayer interconnection structure, the multilayer interconnection structure including a lower interconnection layer and an upper interconnection layer, the lower interconnection layer being closer to the semiconductor substrate than the upper interconnection layer is, and
   the reset transistor includes at least a part of the first semiconductor layer, the first semiconductor layer being in a same layer as the upper interconnection layer.

12. The imaging device according to claim 11, wherein the upper interconnection layer is an uppermost layer of the multilayer interconnection structure.

13. An imaging device comprising:
    a semiconductor substrate; and
    a unit pixel cell including:

a photoelectric converter that includes a pixel electrode and a photoelectric conversion layer located on the pixel electrode, the photoelectric converter converting incident light into charge, the photoelectric converter being located over a surface of the semiconductor substrate;

a charge detection transistor that includes a part of the semiconductor substrate and detects the charge; and a reset transistor that includes a first gate electrode and initializes a voltage of the photoelectric converter, wherein the pixel electrode is above the charge detection transistor, the charge detection transistor is below the reset transistor when viewed in plan, the reset transistor is between the charge detection transistor and the pixel electrode, when viewed from a direction normal to the surface of the semiconductor substrate, the pixel electrode covers an entire portion of the first gate electrode, the imaging device further comprises a first semiconductor layer over the surface of the semiconductor substrate, the part of the semiconductor substrate comprises a first semiconductor material, the unit pixel cell further includes:
 a charge storage capacitance that accumulates at least a part of the charge; and
 a clamp transistor between the charge detection transistor and the pixel electrode, the clamp transistor including a second source electrode, a second drain electrode, a second gate electrode, and at least a part of the first semiconductor layer, the at least the part of the first semiconducting layer comprising a second semiconductor material, the second gate electrode and one of the second source electrode and the second drain electrode being connected to the charge storage capacitance, and a band gap of the second semiconductor material is larger than a band gap of the first semiconductor material.

14. An imaging device comprising:
a semiconductor substrate; and
a unit pixel cell including:
 a photoelectric converter that includes a pixel electrode and a photoelectric conversion layer located on the pixel electrode, the photoelectric converter converting incident light into charge, the photoelectric converter being located over a surface of the semiconductor substrate;
 a charge detection transistor that includes a part of the semiconductor substrate and detects the charge; and
 a reset transistor that includes a first gate electrode and initializes a voltage of the photoelectric converter, wherein the pixel electrode is above the charge detection transistor, the charge detection transistor is below the reset transistor when viewed in plan, the reset transistor is between the charge detection transistor and the pixel electrode, when viewed from a direction normal to the surface of the semiconductor substrate, the pixel electrode covers an entire portion of the first gate electrode, the imaging device comprises a first semiconductor layer over the surface of the semiconductor substrate, the photoelectric converter is located over the surface of the semiconductor substrate through a multilayer interconnection structure, the multilayer interconnection structure including a lower interconnection layer and an upper interconnection layer, the lower interconnection layer being closer to the semiconductor substrate than the upper interconnection layer is, and the reset transistor includes at least a part of the first semiconducting layer, the first semiconducting layer being in a same layer as the upper interconnection layer.

15. The imaging device according to claim 14, wherein the upper interconnection layer is an uppermost layer of the multilayer interconnection structure.

* * * * *